(12) United States Patent
Park et al.

(10) Patent No.: US 9,921,709 B2
(45) Date of Patent: Mar. 20, 2018

(54) ELECTRODE MEMBER AND TOUCH WINDOW INCLUDING THE SAME

(71) Applicant: LG INNOTEK CO., LTD., Seoul (KR)

(72) Inventors: Dong Wook Park, Seoul (KR); Myoung Soo Ahn, Seoul (KR); Duck Hoon Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 151 days.

(21) Appl. No.: 14/797,118

(22) Filed: Jul. 11, 2015

(65) Prior Publication Data
US 2016/0011703 A1  Jan. 14, 2016

(30) Foreign Application Priority Data

Jul. 11, 2014  (KR) .................. 10-2014-0087590
Jul. 11, 2014  (KR) .................. 10-2014-0087591

(51) Int. Cl.
| | |
|---|---|
| *G06F 3/045* | (2006.01) |
| *G06F 3/047* | (2006.01) |
| *G06F 3/041* | (2006.01) |
| *G06F 3/044* | (2006.01) |
| *H05K 1/09* | (2006.01) |

(52) U.S. Cl.
CPC .............. *G06F 3/047* (2013.01); *G06F 3/044* (2013.01); *G06F 3/0412* (2013.01); *G06F 2203/04103* (2013.01); *G06F 2203/04112* (2013.01); *H05K 1/097* (2013.01); *H05K 2201/0145* (2013.01); *H05K 2201/10128* (2013.01); *H05K 2203/107* (2013.01)

(58) Field of Classification Search
CPC ........ G06F 3/044; G06F 3/047; G06F 3/0412; G06F 2203/04103; G06F 2203/04112; H05K 1/097; H05K 2201/0145; H05K 2201/10128; H05K 2203/107
USPC ................... 345/156–184; 257/40; 359/275; 430/285.1
See application file for complete search history.

(56) References Cited

U.S. PATENT DOCUMENTS

| | | | | |
|---|---|---|---|---|
| 6,219,113 | B1* | 4/2001 | Takahara | H04N 9/3167 345/98 |
| 6,239,896 | B1* | 5/2001 | Ikeda | G02F 1/167 359/237 |
| 9,681,540 | B2* | 6/2017 | Lee | G06F 3/044 |
| 2008/0100907 | A1* | 5/2008 | Lipovetskaya | G02B 26/026 359/296 |
| 2010/0021695 | A1* | 1/2010 | Naoyuki | B41N 1/12 428/173 |
| 2010/0265562 | A1* | 10/2010 | Reynolds | G02F 1/15 359/275 |

(Continued)

OTHER PUBLICATIONS

European Search Report for European Patent Application No. 15176327 which corresponds to the above-identified U.S. Application.

*Primary Examiner* — Prabodh M Dharia
(74) *Attorney, Agent, or Firm* — LRK Patent Law Firm

(57) ABSTRACT

The electrode member according to the embodiment includes: a substrate; and an electrode part on the substrate, wherein the electrode part includes a sensing electrode and a wire electrode, at least one electrode of the sensing electrode and the wire electrode includes an opening part and the electrode part has a black color.

13 Claims, 12 Drawing Sheets

(56) References Cited

U.S. PATENT DOCUMENTS

| | | | |
|---|---|---|---|
| 2012/0148949 A1* | 6/2012 | Shimizu | B41N 1/12 430/130 |
| 2012/0194482 A1* | 8/2012 | Kim | G06F 3/0412 345/176 |
| 2012/0327021 A1* | 12/2012 | Ryu | G06F 3/044 345/174 |
| 2013/0050105 A1 | 2/2013 | Lee et al. | |
| 2013/0155011 A1* | 6/2013 | Kim | G06F 3/044 345/174 |
| 2013/0162547 A1 | 6/2013 | Yoo et al. | |
| 2013/0222327 A1* | 8/2013 | Cok | G06F 3/044 345/174 |
| 2013/0241862 A1* | 9/2013 | Kim | C09J 7/0246 345/173 |
| 2013/0278546 A1 | 10/2013 | Kim et al. | |
| 2014/0078111 A1 | 3/2014 | Lee et al. | |
| 2014/0133006 A1* | 5/2014 | Malmstrom | G02F 1/15 359/269 |
| 2014/0134328 A1* | 5/2014 | Choi | G06F 3/044 427/98.4 |
| 2014/0353609 A1* | 12/2014 | Song | H01L 27/3276 257/40 |
| 2015/0160764 A1* | 6/2015 | Bae | G06F 3/045 345/174 |
| 2015/0193047 A1* | 7/2015 | Hoshtanar | G06K 9/0002 345/174 |
| 2015/0205326 A1* | 7/2015 | Lim | B32B 15/04 345/174 |
| 2015/0220175 A1* | 8/2015 | Zhang | G06F 3/044 345/178 |
| 2015/0378253 A1* | 12/2015 | Wang | C09K 19/42 430/285.1 |
| 2016/0077637 A1* | 3/2016 | Weaver | G06F 3/041 345/174 |
| 2016/0103531 A1* | 4/2016 | Kimura | G02F 1/13338 345/174 |
| 2016/0202833 A1* | 7/2016 | Kim | G06F 3/0416 345/173 |
| 2017/0078513 A1* | 3/2017 | Chang | G06F 3/0488 |

* cited by examiner

ELECTRODE MEMBER AND TOUCH WINDOW INCLUDING THE SAME

BACKGROUND

1. Field of the Invention

The embodiment relates to an electrode member and a touch window including the same.

2. Description of Related Art

Recently, a touch panel, which performs an input function through the touch of an image displayed on a display device by an input device such as a stylus pen or a hand, has been applied to various electronic appliances.

The touch panel may be representatively classified into a resistive touch panel and a capacitive touch panel. In the resistive touch panel, the position of the touch point is detected by detecting the variation of resistance according to the connection between electrodes when pressure is applied to the input device. In the capacitive touch panel, the position of the touch point is detected by detecting the variation of capacitance between electrodes when a finger of the user touches the capacitive touch panel. When taking into consideration the convenience of a fabrication scheme and a sensing power, the capacitive touch panel has been spotlighted in a smaller model touch panel recently.

Indium tin oxide (ITO), which has been most extensively used for a transparent electrode of the touch window, is highly expensive, and is easily subject to physical damage due to the bending or the warping of a substrate, so that the characteristic of the ITO for the electrode is deteriorated. Accordingly, the ITO is not suitable for a flexible device. In addition, when the ITO is applied to a large touch panel, a problem may occur due to high resistance.

To solve this problem, research in electrodes are being actively carried out, for example, research to replace the ITO by forming electrode materials into a mesh form are being carried out.

Various methods for fabricating the electrode in a mesh form exist, for example, the method may include forming a pattern part on an electrode member and filling a metal paste in the pattern part.

In this case, when combining the touch window including the electrode with an LCD module, since the electrode may be visible from the outside due to the color difference of the electrode and the LCM, visibility becomes degraded.

Therefore, there is a need to provide an electrode and a touch window having a new structure, which may solve the above-mentioned problems.

SUMMARY

The embodiment provides a touch window having improved visibility.

The electrode member according to the embodiment includes: a substrate; and an electrode part on the substrate, wherein the electrode part includes a sensing electrode and a wire electrode, at least one of the sensing electrode and the wire electrode includes an opening part and the electrode part has a black color.

The electrode member according to the embodiment can improve the visibility of the touch window and the touch device, which include the electrode member. In detail, the degradation of visibility due to color deviation of the electrode material and the driving part can be prevented by controlling the color of the electrode material in the electrode member to be identical or, similar to the driving part of the touch device.

In other words, according to the electrode member of the embodiment, the color of the electrode material is opaque or identical or similar to the color of the driving part, for example, a blackish color, so the light incident from the outside can be effectively reflected, and a metal electrode pattern of the touch window can be prevented from glittering due to the reflection according to a lighting state of a light module when the electrode is coupled to the driving part.

Therefore, the touch window and the touch device including the electrode member according to the embodiment can prevent the visibility from being degraded due to the electrode pattern, thereby improving the overall visibility.

In addition, the touch window and the touch device according to the embodiment do not require a process of forming a separate anti-reflective layer, for example a blackening layer due to a black metal material when the electrode member is formed, so the process efficiency can be improved.

DETAILED DESCRIPTION OF THE EMBODIMENTS

Figure 1:
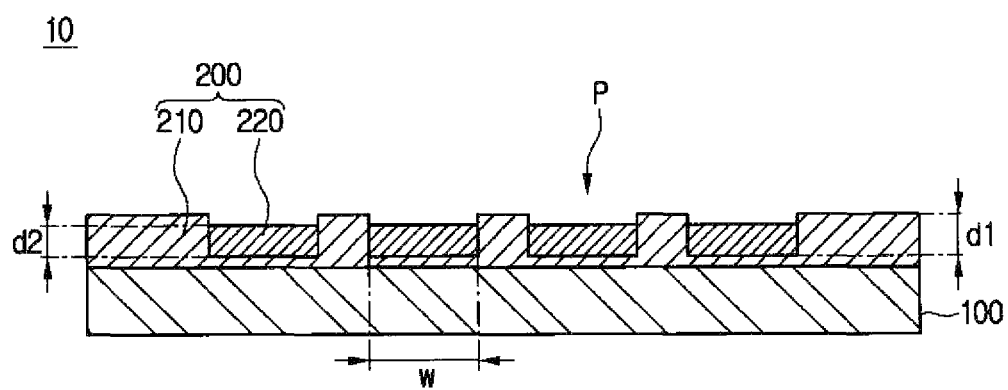
FIG. 1 is a sectional view showing an electrode member according to the first embodiment.

In the following description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

In the following description, when a part is connected to the other part, the parts are not only directly connected to each other, but also indirectly connected to each other while interposing another part therebetween. In addition, when a predetermined part "includes" a predetermined component, the predetermined part does not exclude other components, but may further include other components unless otherwise indicated.

The thickness and size of each layer (or film), each region, each pattern, or each structure shown in the drawings may be modified for the purpose of convenience or clarity of the explanation. In addition, the size of elements does not utterly reflect an actual size.

Figure 2:
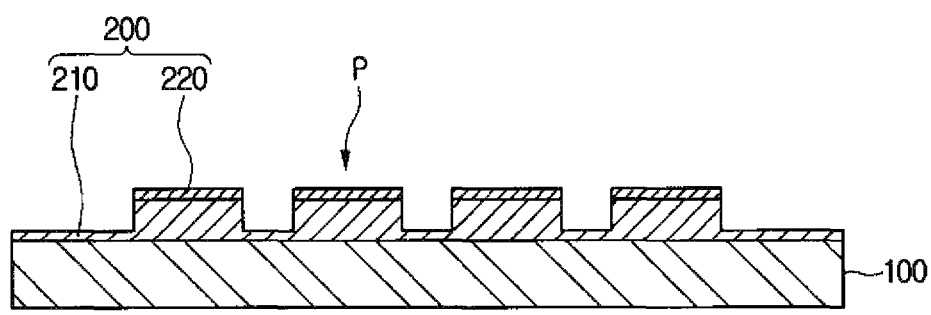
FIG. 2 is another sectional view showing the electrode member according to the first embodiment.

Referring to FIGS. 1 to 2, an electrode member 10 according to the first embodiment may include a substrate 100, and an electrode part 200 on the substrate.

The substrate 100 may support the electrode part 200. That is, the substrate 100 may be a support substrate to support the electrode part 200.

The substrate 100 may be flexible or rigid. For example, the substrate may include glass or plastic.

In detail, the substrate may include chemically tempered/semi-tempered glass, such as soda lime glass or aluminosilicate glass, reinforced/flexible plastic, such as polyimide (PI), polyethylene terephthalate (PET), propylene glycol (PPG), or poly carbonate (PC), or sapphire.

In addition, the substrate 100 may include an optically isotropic film. For example, the substrate 100 may include cyclic olefin copolymer (COC), cyclic olefin polymer (COP), optically isotropic polycarbonate (PC), or optically, isotropic polymethyl methacrylate (PMMA).

The sapphire has superior electric characteristics, such as permittivity, so that a touch response speed may be greatly increased and a space touch such as hovering may be easily implemented. In addition, since the sapphire has high surface hardness, the sapphire is applicable to a cover substrate. The hovering refers to a technique of recognizing coordinates even at a slight distance from a display.

In addition, the substrate 100 may be partially bent to have a curved surface. That is, the substrate 100 may have a partial flat surface and a partial curved surface. In detail, an end of the substrate 100 may be bent to have a curved surface or may be bent or flexed to have a surface including a random curvature.

Further, the substrate 100 may include a flexible substrate having a flexible property.

Further, the substrate 100 may include a curved or bended substrate. That is, the electrode member including the substrate 100 may also be formed to have a flexible, curved or bended property.

A sensing electrode, a wire electrode and a printed circuit board may be disposed on the substrate 100. That is, the substrate may be a support substrate.

The substrate may have an active area AA and an unactive area UA defined therein.

An image may be displayed in the active area AA and the image may not be displayed in the unactive area UA provided around the active area AA.

In addition, the position of an input device (e.g., a finger, a stylus pen, etc.) may be sensed in at least one of the active area AA and the unactive area UA. If the input device, such as a finger, touches the touch window, the variation of capacitance occurs in the touched part by the input device, and the touched part subject to the variation of the capacitance may be detected as a touch point.

The electrode part 200 may be disposed on the substrate 100. The electrode part 200 may include a base material 210 and an electrode material 220 on the electrode material 210.

The base material 210 may include plastic. In detail, the base material 210 may be a resin layer. In more detail, the base material 210 may be a resin layer including a photo-curable resin such as a UV resin or a thermosetting resin.

A pattern part P may be formed on the base material 210. In detail, a plurality of pattern parts P spaced apart from each other may be formed on the base material 210. Accordingly, the pattern part P and a non-pattern part NP may be formed on the base material 210.

For example, an embossed or an engraved pattern part P may be formed on the base material 210. In detail, in FIG. 1, the engraved pattern part P may be formed on the base material 210, and, in FIG. 2, the embossed pattern part P may be formed on the base material 210. In addition, the pattern part P may be entirely formed in form of a mesh. That is, when viewed from one surface of the base material 210, the entire form of the pattern part P may be in a form of a mesh.

In addition, the pattern part P may have a constant width. For example, the width of the pattern part P may be about 10 μm or less. In other words, the width of the pattern part P may exceed 0 μm and be equal to or less than 10 μm. In detail, the width of the pattern part P may exceed 0 μm and be equal to or less than 5 μm. In more detail, the width of the pattern part P may be about 1.5 μm to about 3 μm.

If the width of the pattern part P exceeds about 10 μm, an electrode material may be visually recognized from an outside, so the visibility may be degraded.

The electrode material 220 may be disposed on the base material 210. In detail, the electrode material 220 may be disposed in the pattern part P on the base material 210. Accordingly, the electrode material 220 may be disposed on the base material 210 in a form of a mesh. In other words, the electrode material 220 disposed in the pattern part P in a form of a mesh may be arranged in a form of a mesh identical to the pattern part P.

The electrode material 220 may include a metal. For example, the electrode material 220 may include at least one of Cr, Ni, Cu, Al, Ag, Mo, Au, Ti and an alloy thereof. Accordingly, design freedom may be improved when the electrode member is employed to the touch window and the like to which flexibility and/or bending is implemented.

The electrode material 220 may have a black color. Because the electrode material 220 has a black color, reflection due to the total reflection property of the electrode including the metal may be prevented. In addition, the glitter inherent to the metal may be alleviated. Thus, the visibility may be improved.

In addition, the electrode material may have a psychrometric lightness (L*) of 60 or less. In detail, the electrode material may have, a psychrometric lightness (L*) of about 40 to about 60. In more detail, the electrode material may have a psychrometric lightness (L*) of about 45 to about 60. In this case, the psychrometric lightness (L*) is an index which indicates brightness and represents a white color when the index becomes closer to 100 and represents a black color when the index becomes closer to 0.

The metal included in the electrode material 220 may be heated at a predetermined temperature by laser and the like, and the surface of the metal, that is, the metallic particle or the entire part of the metallic particle may be carbonized, so the electrode material may have a blackish color, for example, a black color.

The electrode material 220 in a paste form may be filled in the pattern part P on the base material 210 and cured. In detail, the electrode material may include the metal, an organic vehicle, a binder and the like, and the electrode material in a paste form, in which the metal, an organic vehicle, a binder and the like are combined, is filled in the pattern part P on the base material 210.

For example, a metal paste, in which the metallic particle having a sphere shape and a particle size of about 50 nm to 150 nm, a solvent and the binder are combined, is filled into the pattern part P.

In this case, the metal paste may include about 75 weight % to about 80 weight % of the metallic particles.

In addition, the binder provides adhesiveness between the metallic particle and the base material. For example, the binder may include any one material from a group of epoxy, ester, acryl and vinyl, but the embodiment is not limited thereto.

In addition, the solvent may include an organic solvent for dissolving the binder. For example, the solvent may include any one material from a group of alcohols, glycols, polyols, ethers, glycol ethers, glycol ether esters and esters, but the embodiment is not limited thereto.

In addition, the metal paste may further include a dispersant having acryl or carboxyl functional groups to improve the dispersibility of the metallic particle.

Next, the metal paste may be heated at about 100° C. for tens of minutes and cured.

In the embodiment, the electrode part is formed by filling the metal paste in the pattern part, then curing the metallic paste, but the embodiment is not limited thereto. The electrode part including the electrode material in a form of, a mesh and having a black color may be fabricated by etching the electrode material, that is, the metal after directly depositing or plating the metal on the base material.

The electrode material 220 may be filled in the pattern part P by a predetermined height. In detail, the height d1 of the pattern part P may be about 1 μm to 6 μm. In more detail, the height d1 of the pattern part P may be about 4 μm to 5.5 μm, and the electrode material 220 may be arranged to have a height d2 of about 70% to about 90% based on the height of the pattern part P. For example, the height d2 of the electrode material 220 may be about 2.8 μm to about 4.95 μm.

When the height d2 of the electrode material 220 is less than about 70% based on the height d1 of the pattern part, the metal paste is not sufficiently filled in the pattern part so conductivity may be degraded, and when exceeding about 90%, the metal paste flows to the outside of the pattern part, thus a short circuit may occur and reliability may be degraded.

Hereinafter, the electrode member according to the second embodiment will be described with reference to FIGS. 3 to 5. In the following description of the electrode member according to the second embodiment, the detailed descriptions about the parts similar or identical to those described in the electrode member of the first embodiment will be omitted in order to avoid redundancy. In other words, the electrode member according to the second embodiment is fundamentally combined with the electrode member of the first embodiment.

Figure 3:
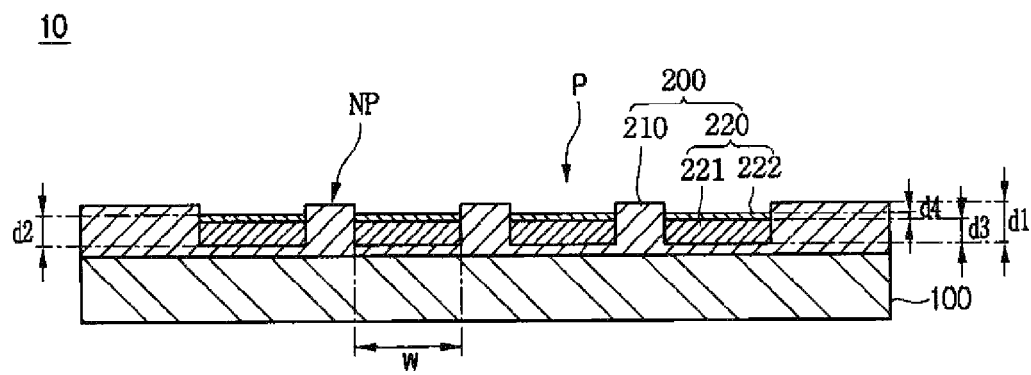
FIG. 3 is a sectional view showing the electrode member according to the second embodiment.
Figure 4:
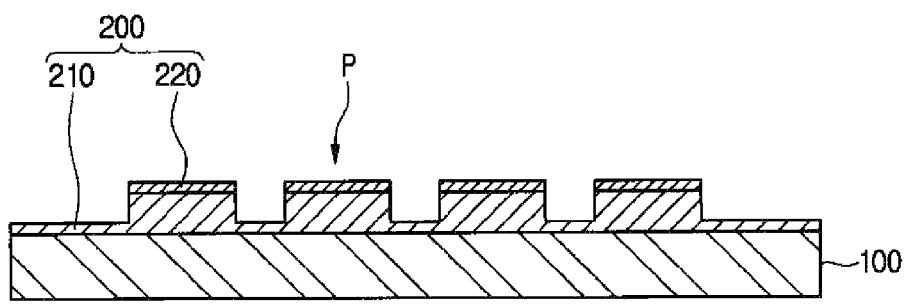
FIG. 4 is another sectional view showing the electrode member according to the second embodiment.

Referring to FIGS. 3 and 4, the electrode member according to the second embodiment may include at least two electrode materials. In addition, at least one of the electrode materials may have a black color.

At least one of the electrode materials may have a psychrometric lightness (L*) of 60 or less. In detail, the electrode material may have a psychrometric lightness (L*) of about 40 to about 60. In more detail, the electrode material may have a psychrometric lightness (L*) of about 45 to about 60.

The electrode material 220 may include first and second electrode materials 221 and 222. In detail, the electrode material 220 may include first and second electrode materials 221 and 222, which are disposed in the pattern part P. In more detail, the electrode material 220 may include the first electrode material 221 disposed in the pattern part P and the second electrode material 222 disposed on the first electrode material 221 in the pattern part P.

The first electrode material 221 may be formed integrally with the second electrode material 222. In addition, the first and second electrode materials 221 and 222 may form a boundary surface.

The first and second electrode materials 221 and 222 may include the metal described above. In detail, the first and second electrode materials 221 and 222 may be identical or include mutually different metals.

Thus, the first and second electrode materials 221 and 222 may degrade the reflection and the glittering while having conductivity, thus the visibility can be improved.

The psychrometric lightness (L*) of the first and second electrode materials 221 and 222 may be mutually different. In detail, the psychrometric lightness (L*) of the second electrode material may be lower than the psychrometric lightness (L*) of the first electrode material. In other words, the second electrode material 222 may have a color closer to a black color than that of the first electrode material 221.

In addition, the first and second electrode materials 221 and 222 may have mutually different colors. In detail, the second electrode material 222 may have a black color.

In addition, the second electrode material 222 may have a darker blackish color than that of the first electrode material 221. Thus, the electrode material may degrade the glittering according to the metal property by the second electrode material 222 such that the visibility is improved and the reflection of light is degraded.

For example, the first electrode material 221 may have a gray color, and the second electrode material 221 may have a darker blackish color than the gray color.

The second electrode material 222 may include carbonized metal. In other words, the metal included in the second electrode material 222 may be heated at a predetermined temperature by laser and the like, and the surface of the metal, that is, the metallic particle or the entire part of the metallic particle may be carbonized, so the electrode material may have a blackish color, for example, a black color.

In addition, the first and second electrode materials 221 and 222 may be arranged to have mutually different heights. In other words, the height d3 of the first electrode material 221 may be higher than the height d4 the second electrode material 222. In more detail, the ratio of the height d3 of the first electrode material 221 and the height d4 the second electrode material 222 may be about 6:4 to about 8:2.

When the ratio of the height d3 of the first electrode material 221 and the height d4 the second electrode material 222 is outside the bounds of the range, the electrode pattern is visible from the outside so the visibility may be degraded.

In detail, the electrode material 220 in a paste form may be filled in the pattern part P on the base material 210 and cured. In detail, the electrode material may include the metal, the organic vehicle, the binder and the like, and the electrode material in a paste form, in which the metal, the organic vehicle, the binder and the like are combined, is filled in the pattern part P on the base material 210.

In detail, after the first electrode material 221 is filled in the pattern part P by a predetermined height, the second electrode material 222 may be filled in the pattern part P by a predetermined height on the first electrode material.

In the above embodiments, the electrode material including the first and second electrode materials is described, but the embodiment is not limited thereto, and the electrode material may further include a third electrode material.

Figure 5:
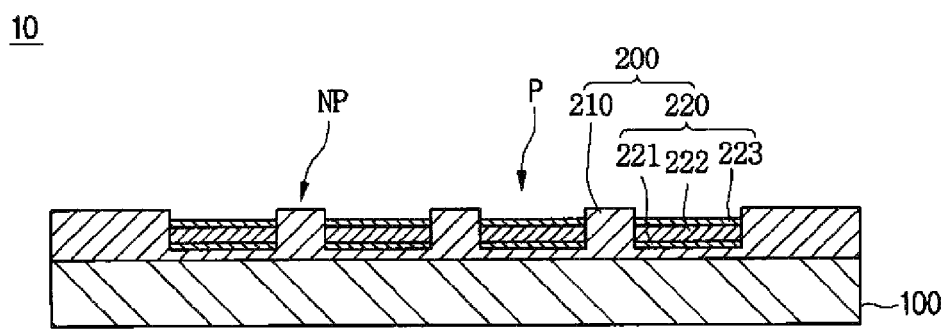
FIG. 5 is still another sectional view showing the electrode member according to the second embodiment.

Referring to FIG. 5, the electrode material 220 may include first, second and third electrode materials 221, 222 and 223.

In detail, the electrode material 220 may include first, second and third electrode materials 221, 222 and 223, which are disposed in the pattern part P.

In more detail, the electrode material 220 may include the first electrode material 221 disposed in the pattern part P, the second electrode material 222 disposed on the first electrode material 221 in the pattern part P and the third electrode material 223 disposed on the second, electrode material 222 in the pattern part P.

The psychrometric lightness of the first, second and third electrode materials 221, 222 and 223 may be mutually different. In detail, the psychrometric lightness (L*) of the first and third electrode materials 221 and 223 may be lower than the psychrometric lightness of the second electrode material 222.

In other words, the first and third electrode materials 221 and 223 may have a color closer to the black color than that of the second electrode material 222.

In addition, the first and third electrode materials 221 and 223 may have colors different from the second electrode material 222. In detail, the first and third electrode materials 221 and 223 may have a black color.

Figure 6:
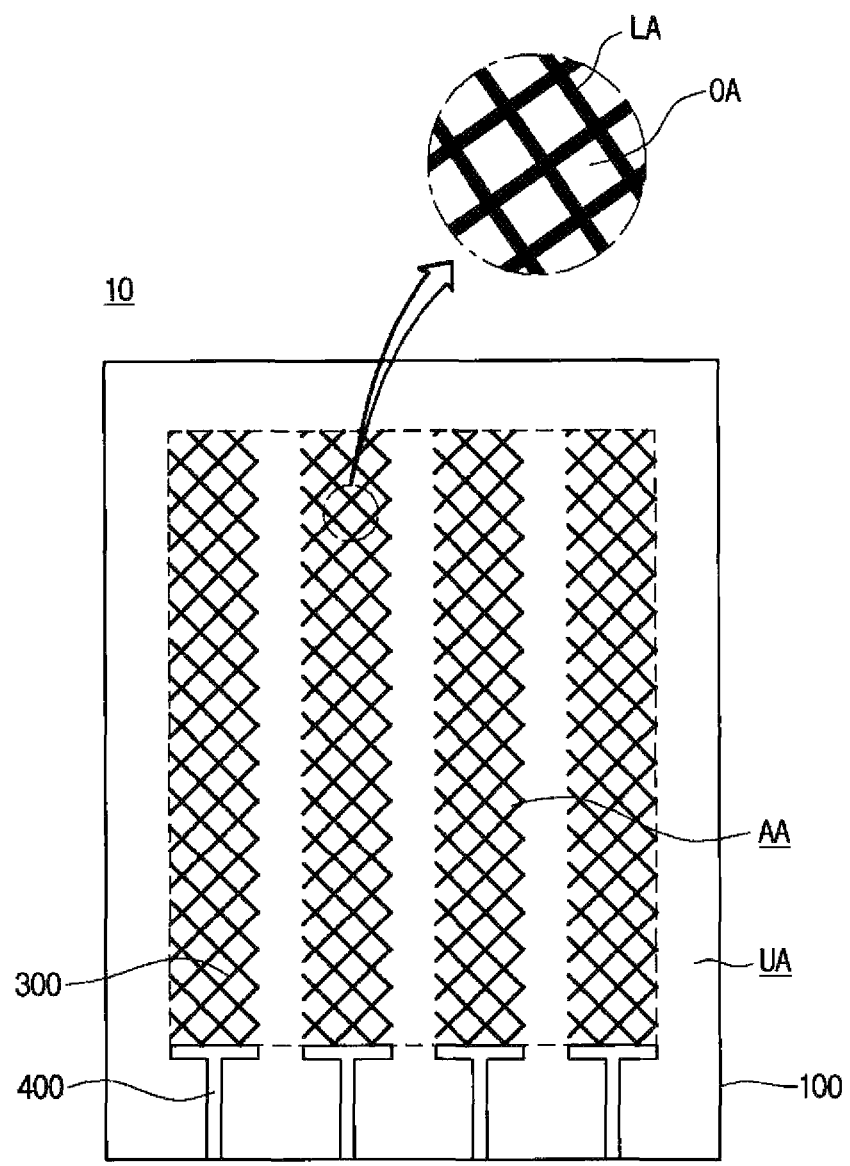
FIG. 6 is a plan view showing the electrode member according to the embodiments.

Referring to FIG. 6, the electrode part 200 may include the sensing electrode and/or the wire electrode. In other words, the electrode part 200 may include the sensing electrode and/or the wire electrode in a form of a mesh.

In detail, the sensing electrode 300 and/or the wire electrode 400 may include a mesh line LA formed by a plurality of sub-electrodes intersecting in a mesh form and a mesh opening part OA defined by the mesh line LA between the mesh lines LA.

The mesh opening part OA may have various shapes. For example, the mesh opening part OA may have various shapes such as a polygonal shape including a rectangular shape, a diamond shape, a pentagon shape, or a hexagonal shape, or a circular shape. In addition, the mesh opening part OA may have a regular shape or a random shape.

The sensing electrode 300 and/or the wire electrode 400 may be formed in a form of a mesh, so that the pattern of the sensing electrode 300 and/or the wire electrode 400 may not be visually recognized on the active area AA or the unactive area UA. That is, even when the sensing electrode is formed of an opaque material, for example the metal, the pattern may not be viewed. In addition, even when the sensing electrode is applied to a large-size touch window, the resistance of the touch window may be lowered.

The electrode part 200 may be employed to at least one of the sensing electrode 300 and the wire electrode 400. In other words, only the sensing electrode 300 may include the electrode part 200, only the wire electrode 400 may include the electrode part 200 or both of the sensing electrode 300 and the wire electrode 400 may include the electrode part 200.

When the electrode part 200 is employed to the sensing electrode 300 or the wire electrode 400, other electrodes may be employed to other types of electrode parts. For example, after the metal is deposited on the substrate, the metal is etched to form the electrode in a form of a mesh, or, after a nano pattern and a micro pattern is formed on the base material and the metal is disposed on all of the nano pattern and the micro pattern, the metal is etched to remove the metal formed on the nano pattern such that the electrode in a form of a mesh may be formed.

Alternately, when the electrode part 200 is employed on the sensing electrode 300 and the wire electrode 400, the sensing electrode 300 and the wire electrode 400 may include same or mutually different pattern parts.

For example, both of the sensing electrode 300 and the wire electrode 400 may include an engraved pattern part.

Alternately, both of the sensing electrode 300 and the wire electrode 400 may include an embossed pattern part.

Otherwise, the sensing electrode 300 may include an engraved pattern part and the wire electrode 400 may include an embossed pattern part.

Alternately, the sensing electrode 300 may include an embossed pattern part and the wire electrode 400 may include an engraved pattern part.

The sensing electrode 300 the wire electrode 400 may be connected to each other. In detail, one end of the wire electrode 400 may be connected to the sensing electrode 300, and the other end of the wire electrode 400 may be connected to a printed circuit board (not shown).

The sensing electrode 300 and the wire electrode 400 may be simultaneously formed. In detail, the process for forming the sensing electrode 300 and the wire electrode 400 may be simultaneously formed by one process.

In other words, the sensing electrode and the wire electrode, which are formed on one surface of the substrate, may be printed at once by a simultaneous process through a printing process, that is, a direct printing process.

In addition, even when the sensing electrode and the wire electrode are formed on the other surface of the substrate, the sensing electrode and the wire electrode may be printed at once by the simultaneous process. Thus, a process efficiency may be improved.

In addition, even when the sensing electrode and the wire electrode are formed on both of the one surface and the other surface of the substrate, the sensing electrode and the wire electrode may be printed at once by the simultaneous process.

In detail, a first blanket, a second blanket, a first pattern roll and a second pattern roll are disposed on both surfaces of the substrate, array cameras are disposed on the first pattern roll and the second pattern roll and the electrode forming position is marked, then, the first and second electrodes may be simultaneously printed on the one surface and the other surface of the substrate by using the first and second blankets, and the first and second pattern rolls.

Hereinafter, the disclosure will be described in more detail through the electrode member according to embodiments and comparison examples. The embodiments are for illustrative purposes only for a more detailed description of the disclosure. Therefore, the disclosure is not limited to the embodiments.

Experimental Example 1

Ag paste of embodiments 1 and 2 and comparison example 1 was coated on polyethylene terephthalate (PET). Then, in embodiments 1 and 2, the Ag paste was heated by laser and cured, in comparison example 1, the Ag paste was not heated and cured. Then, the psychrometric lightness of the Ag paste according to embodiments 1 and 2 and comparison example 1 were measured.

Experimental Example 2

Ag paste of embodiments 3 and 4 and comparison example 2 was coated on polyethylene terephthalate (PET). Then, in embodiments 3 and 4, the Ag paste was first coated for a first time, then the Ag paste was coated for a second time, then the Ag paste was heated by laser and cured. In comparison example 2, the Ag paste was coated for a first time, then the Ag paste was not heated and cured. Then, the psychrometric lightness of the Ag paste according to embodiments 3 and 4 and comparison example 2 were measured.

TABLE 1

|  | Psychrometric lightness (L*) |
| --- | --- |
| Embodiment 1 | 47.89 |
| Embodiment 2 | 59.81 |
| Embodiment 1 | 67.23 |

Referring to Table 1, the psychrometric lightness values of the silver (Ag) paste of embodiments 1 and 2 were less than about 60. However, the psychrometric lightness value of the silver (Ag) paste of comparison example 1 exceeded 60.

In other words, the colors of the silver pastes of embodiments 1 and 2 became closer to black.

Thus, when the electrode member is fabricated by using the silver paste according to embodiments 1 and 2 as the electrode material, the electrode member may be formed with a color similar to that of the drive part, that is, a blackish color, so light incident from the outside may be effectively reflected, and the metal electrode pattern of the touch window can be prevented from glittering by the reflection according to the lighting state of the light module when the electrode member and the drive part are combined, so that the visibility may be improved.

TABLE 2

|  | Psychrometric lightness (L*) |
| --- | --- |
| Embodiment 3 | 45.85 |
| Embodiment 4 | 57.83 |
| Embodiment 2 | 69.37 |

Referring to Table 2, the psychrometric lightness values of the silver (Ag) paste of embodiments 3 and 4 were less than about 60. However, the psychrometric lightness value of the silver (Ag) paste of comparison example 2 exceeded 60.

In other words, the colors of the silver pastes of embodiments 3 and 4 became closer to black.

Thus, when the electrode member is fabricated by using the silver paste according to embodiments 3 and 4 as the electrode material, the electrode member may be formed with a color similar to that of the drive part, that is, a blackish color, so light incident from the outside may be effectively reflected, and the metal electrode pattern of the touch window can be prevented from glittering by the reflection according to the lighting state of the light module when the electrode member and the drive part are combined, so that the visibility may be improved.

In other words, by forming the lower part of the electrode into a blackish color, the metal electrode pattern of the touch window glittering by the reflection according to the lighting state of the light module when the electrode member and the drive part are combined may be prevented, and by forming the upper part of the electrode into a blackish color, light incident from the outside and light reflected from the inside may be effectively reflected.

Therefore, by forming the upper part and/or the lower part of the electrode into the blackish color, the internal and external light of the touch window may be effectively reflected, thus the visibility of the touch window may be improved.

FIGS. 7 to 20 are views showing various types of touch windows in which the electrode member according to the embodiments are employed.

Figure 7:
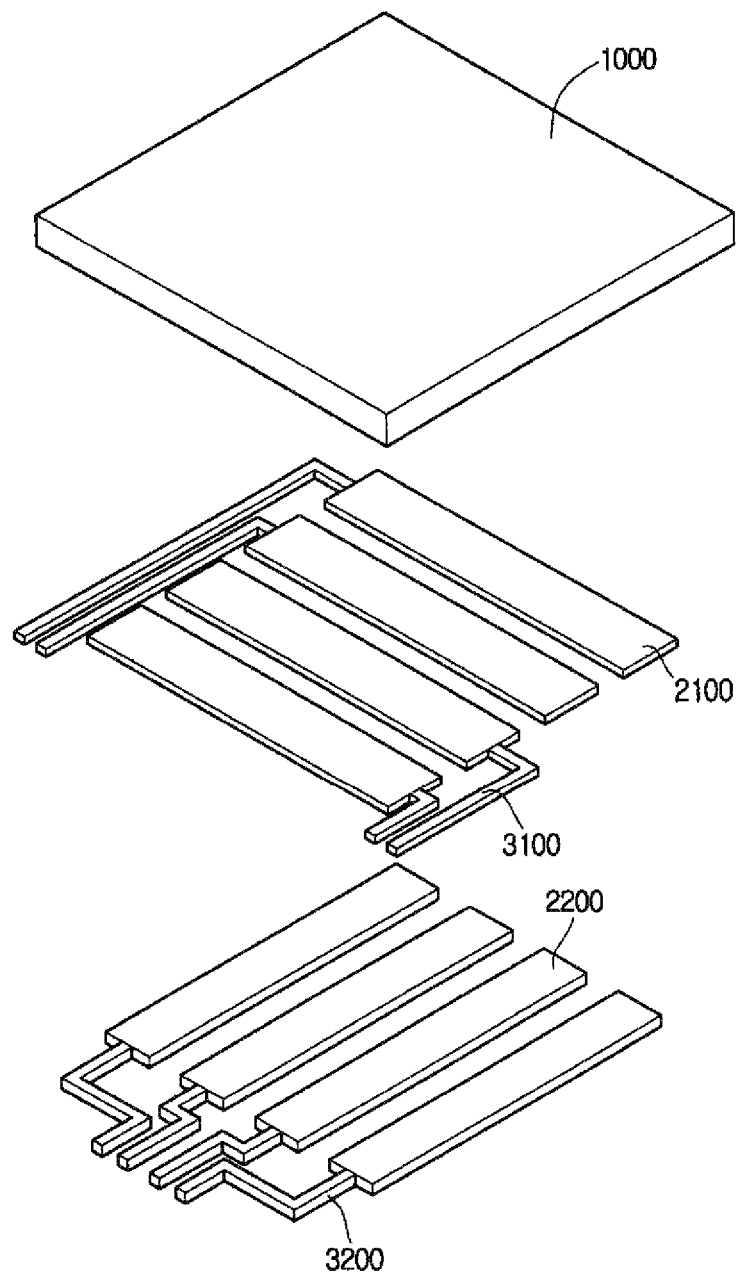
FIGS. 7 to 11 are views showing various types of touch windows to which the electrode member according to the embodiment is employed.

Referring to FIG. 7, the touch window 20 according to the embodiment may include a substrate 1000 and first and second electrodes on the substrate 1000.

In detail, the first and second sensing electrodes 2100 and 2200 extended in mutually different directions and first and second wire electrodes 3100 and 3200 connected to the first and second sensing electrodes 2100 and 2200, respectively, are disposed on one surface of the substrate 1000, and the first and second sensing electrodes 2100 and 2200 are insulated from each other on a same one surface of the substrate 1000.

In addition, at least one electrode of the first and second sensing electrodes 2100 and 2200 and the first and second wire electrodes 3100 and 3200 may include the electrode member.

Figure 8:
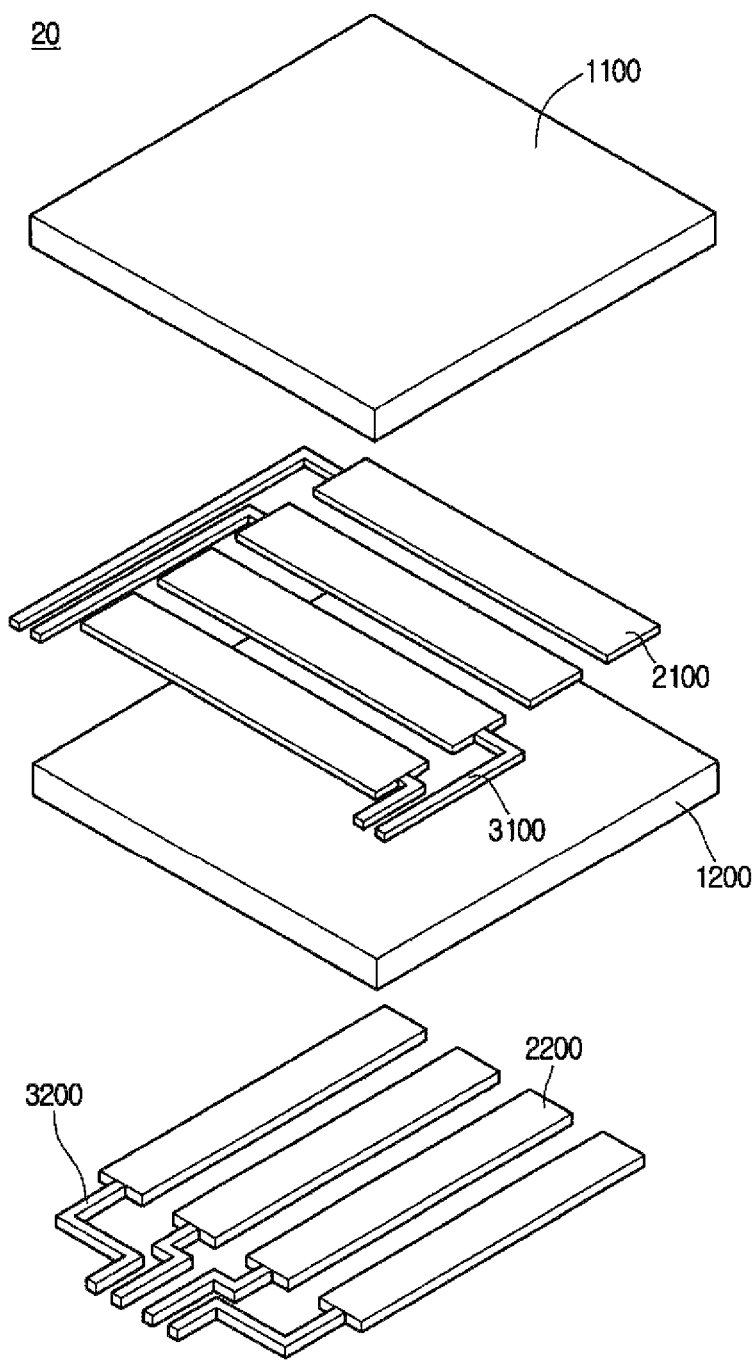

Referring to FIG. 8, the touch window 20 according to embodiments may include a first substrate 1100, a second substrate 1200, a first sensing electrode on the first substrate 1100 and a second sensing electrode on the second substrate 1200.

In detail, the first sensing electrode 2100 extended in one direction and the first wire electrode 3100 connected to the first sensing electrode 2100 are disposed on one surface of the first substrate 1100, and the second sensing electrode 2200 extended in a direction different from the one direction and the second wire electrode 3200 connected to the second sensing electrode 2200 are disposed on one surface of the second substrate 1200

In addition, at least one electrode of the first and second sensing electrodes 2100 and 2200 and the first and second wire electrodes 3100 and 3200 may include the electrode member.

Figure 9:
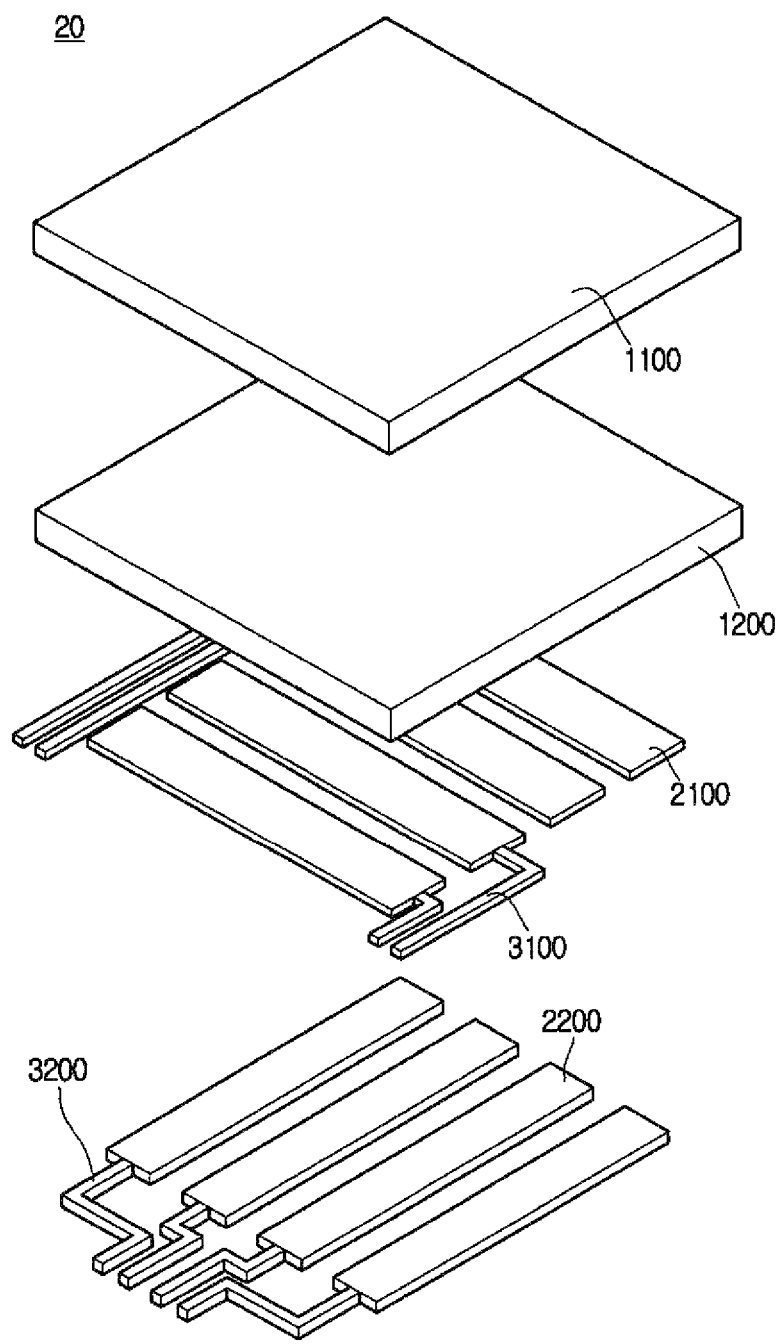

Referring to FIG. 9, the touch window 20 according to embodiments may include the first substrate 1100, the second substrate 1200, the first sensing electrode on the second substrate 1200 and the second sensing electrode on the first substrate 1100.

In detail, the first and second sensing electrodes extended in mutually different directions are disposed on one surface of the second substrate 1200, and the first and second sensing electrodes are insulated from each other on a same one surface of the substrate 1000.

In addition, at least one electrode of the first and second sensing electrodes 2100 and 2200 and the first and second wire electrodes 3100 and 3200 may include the electrode member.

Figure 10:
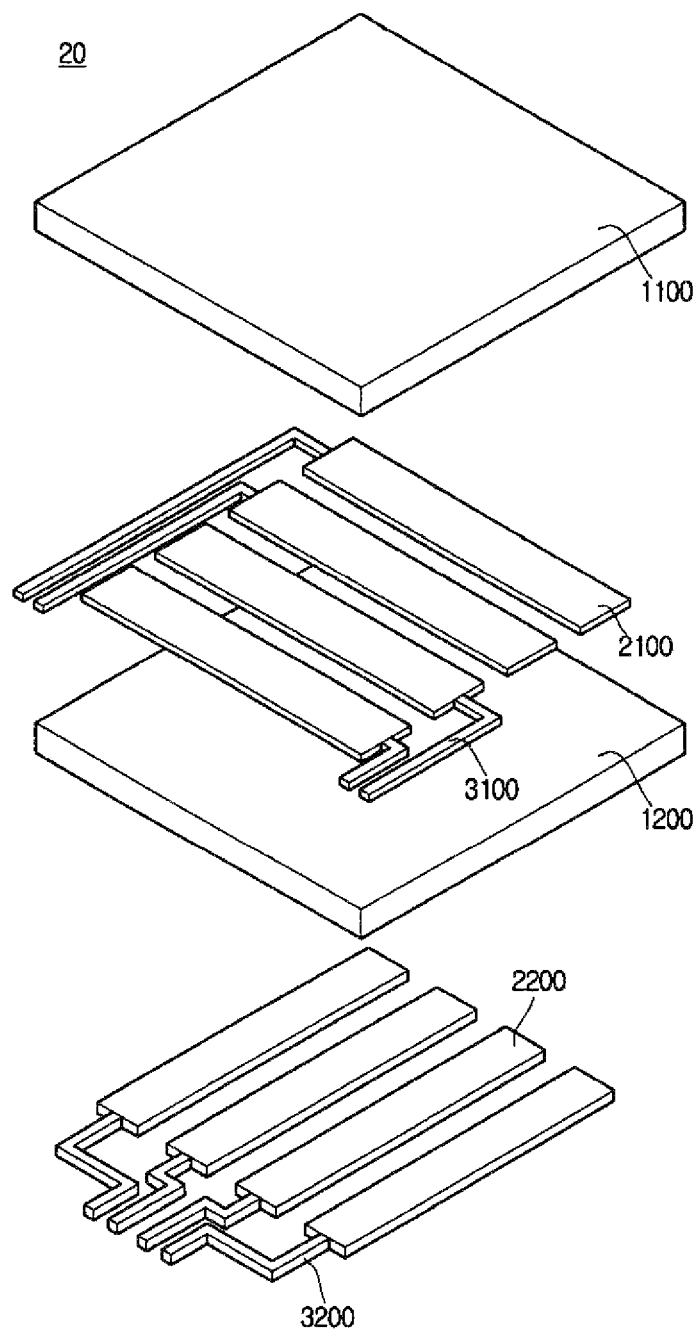

Referring to FIG. 10, the touch window 20 according to embodiments may include the first substrate 1100, the second substrate 1200, the first sensing electrode and the second sensing electrode on the second substrate 1200.

In detail, the first sensing electrode 2100 extended in one direction and the first wire electrode 3100 connected to the first sensing electrode 2100 are disposed on one surface of the second substrate 1200, and the second sensing electrode 2200 extended in a direction different from the one direction and the second wire electrode 3200 connected to the second sensing electrode 2200 are disposed on the other surface of the second substrate 1200

In addition, at least one electrode of the first and second sensing electrodes 2100 and 2200 and the first and second wire electrodes 3100 and 3200 may include the electrode member.

Figure 11:
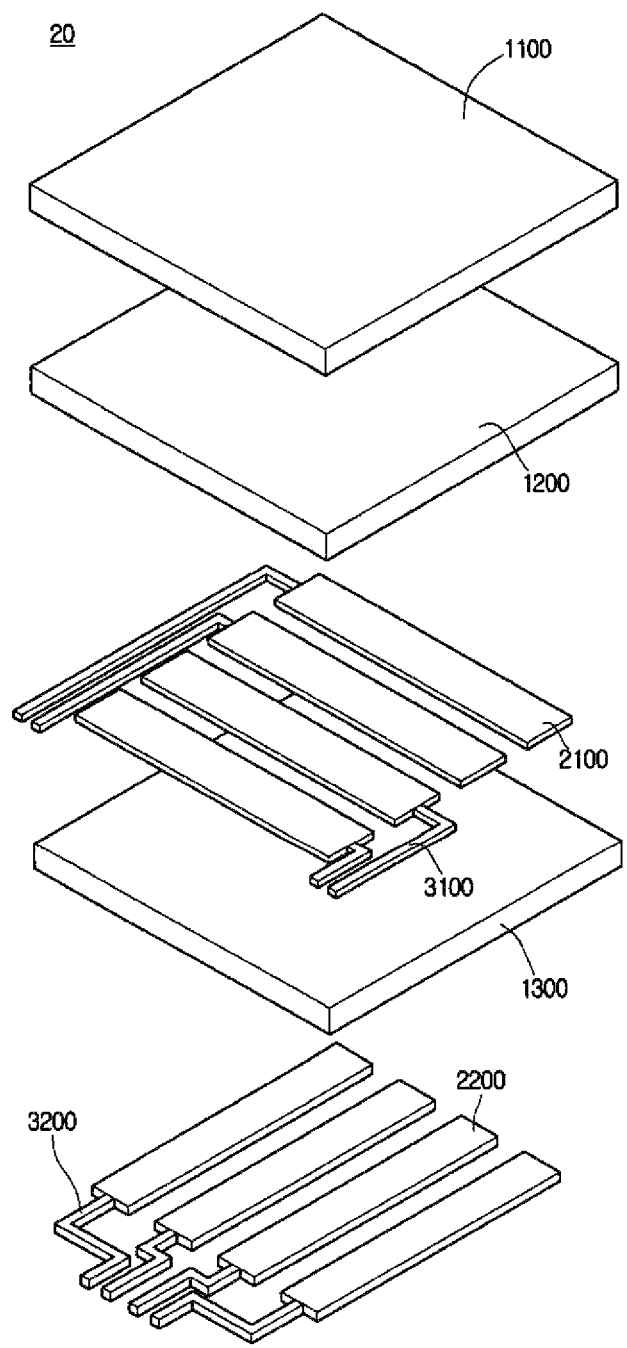

Referring to FIG. 11, the touch window 20 according to embodiments may include the first substrate 1100, the second substrate 1300, a third substrate 1300, a first sensing electrode on the second substrate 1200 and a second sensing electrode on the third substrate 1300.

In detail, the first sensing electrode 2100 extended in one direction and the first wire electrode 3100 connected to the first sensing electrode 2100 are disposed on one surface of the second substrate 1200, and the second sensing electrode 2200 extended in a direction different from the one direction and the second wire electrode 3200 connected to the second sensing electrode 2200 are disposed on one surface of the third substrate 1300

In addition, at least one electrode of the first and second sensing electrodes 2100 and 2200 and the first and second wire electrodes 3100 and 3200 may include the electrode member.

Hereinafter, a touch device, in which the above-described touch window and a display panel are coupled to each other, will be described with reference to FIGS. 12 to 14.

Figure 12:
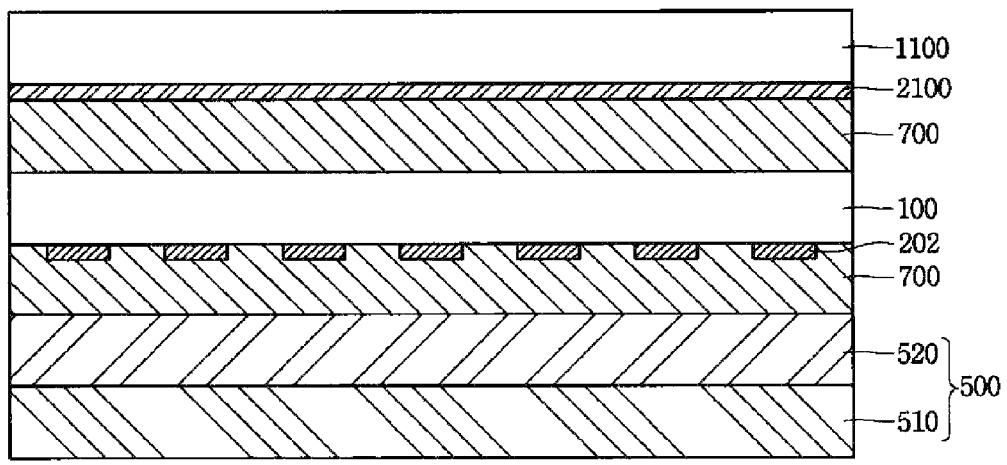
FIGS. 12 to 14 are sectional views showing a touch device according to the embodiment.

Referring to FIG. 12, the touch device according to an embodiment may include the touch window disposed on the display panel 500.

Referring to 12, the first substrate 1100 may be disposed on the second substrate 1200. The first substrate 1100 may be a cover substrate. The first substrate 1100 and the second substrate 1200 may be bonded to each other through an adhesive layer 700. In addition, the first and second sensing electrodes 2100 and 2200 may be disposed on the first substrate 1100 and/or the second substrate 1200. In addition, the substrate 100 and the display panel 500 may be bonded to each other through an adhesive layer 700. For example, the substrate 1200 and the display panel 500 may be bonded to each other through the adhesive layer 700 including optical clear adhesive (OCA).

The display panel 500 may include first and second substrates 510 and 520.

If the display panel 500 is a liquid crystal display panel, the display panel 500 may have a structure in which the first substrate 510 including a thin film transistor (TFT) and a pixel electrode is combined with the second substrate 520 including color filter layers while a liquid crystal layer is interposed between the first and second substrates 610 and 620.

Further, the display panel 500 may be a liquid crystal display panel having a color filter on transistor (COT) structure formed by combining the first substrate 510 formed thereon with the TFT, a color filter, and a black matrix with the second substrate 520 while the liquid crystal layer is interposed between the first and second substrates 510 and 620. In other words, the TFT may be formed on the first substrate 510, a protective layer may be formed on the TFT, and the color filter layer may be formed on the protective layer. In addition, the pixel electrode, which makes contact with the TFT, is formed on the first' substrate 510. In this case, to improve an aperture ratio and simplify a mask process, the black matrix may be omitted, and a common electrode may perform a function of the black matrix together with the inherent function thereof.

In addition, when the display panel 500 is a liquid crystal panel, the display device may further include a backlight unit for providing light at the back of the display panel 500.

When the display panel 500 is an organic light emitting device, the display panel 500 includes a self light-emitting device which does not require any additional light source. A thin film transistor is formed on the first substrate 510 of the display panel 500, and an organic light-emitting device (OLED) making contact with the thin film transistor is formed. The OLED may include an anode, a cathode and an organic light-emitting layer formed between the anode and the cathode. In addition, the display panel 600 may further include the second substrate 520, which performs the function of an encapsulation substrate for encapsulation, on the OLED.

Figure 13:
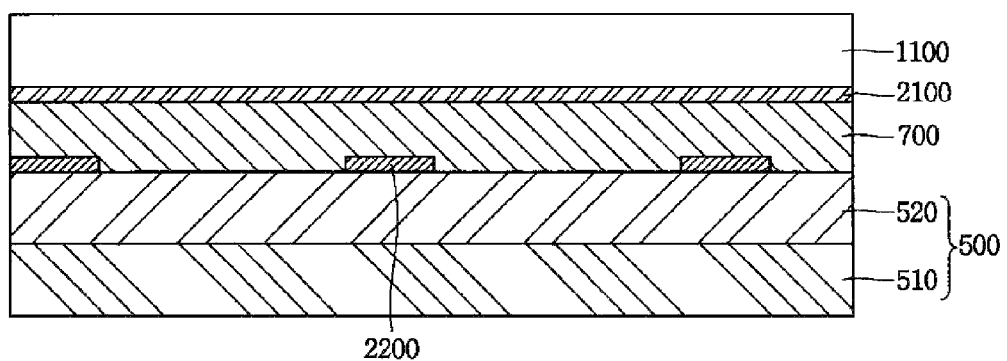

Referring to FIG. 13, a touch device according to an embodiment may include a touch window formed integrally with the display panel 500. That is, a substrate supporting at least one sensing electrode may be omitted.

In detail, at least one sensing electrode may be disposed on at least one surface of the display panel 500. That is, at least one sensing electrode may be formed on at least one surface of the first substrate 510 or the second substrate 520.

In this case, at least one sensing electrode may be formed on a top surface of the substrate disposed at an upper portion.

Figure 18:
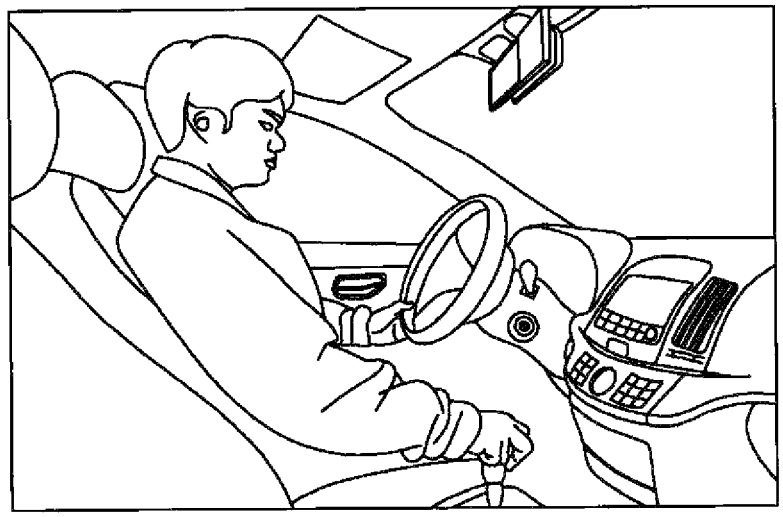

Referring to FIG. 18, a first sensing electrode 2100 may be disposed on one surface of the first substrate 1100. In addition, the first wire connected to the first sensing electrode 2100 may be disposed on the one surface of the substrate 100. In addition, the second sensing electrode 2200 may be disposed on one surface of the display panel 500. Further, the second wire connected to the second sensing electrode 2200 may be disposed on the one surface of the display panel 600.

The adhesive layer 700 may be disposed between the substrate 1100 and the display panel 500 so that the first substrate 100 is combined with the display panel 500.

In addition, the substrate 100 may further include a polarizing plate below the substrate 100. The polarizing plate may be a linear polarizing plate or an anti-reflection polarizing plate. For example, when the display panel 500 is a liquid crystal display panel, the polarizing plate may be a linear polarizing plate. In addition, when the display panel 500 is an organic electroluminescent display panel, the polarizing plate may be an anti-reflection polarizing plate.

According to a touch device of an embodiment, at least one substrate 100 for supporting the sensing electrode 300 may be omitted. Thus, a touch device having a thin thickness and a light weight may be formed.

Next, a touch device according to still another embodiment will be described with reference to FIG. 14. In the following description, the parts similar or identical to those of the previously described embodiment will be omitted for the purpose of clear and brief description. The same reference numbers will be assigned to the same elements.

Figure 14:
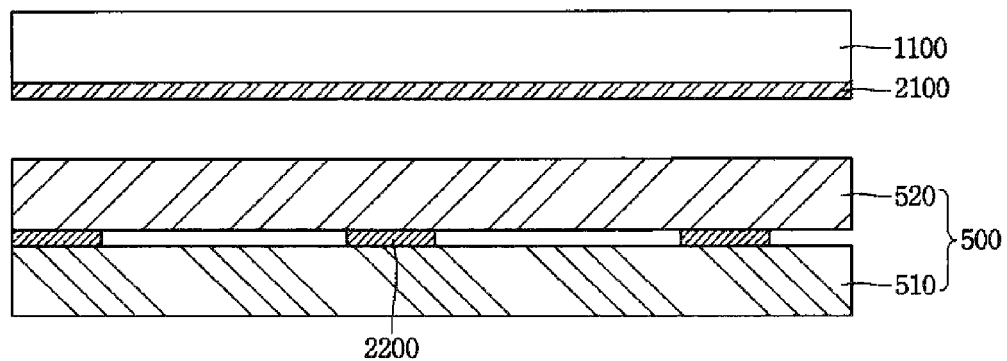

Referring to FIG. 14, a touch device according to an embodiment may include a touch panel integrated with the display panel 500. That is, a substrate supporting at least one sensing electrode may be omitted.

For example, a sensing electrode, which serves as a sensor disposed in an active area to sense a touch, and a wire, through which an electrical signal is applied to the sensing electrode, may be formed inside the display panel. In detail, at least one sensing electrode or at least one wire may be disposed inside the display panel.

The display panel includes the first and second substrates 510 and 520. In this case, at least one of the first and second sensing electrodes 2100 and 2200 is disposed between the first and second substrates 510 and 520. That is, at least one sensing electrode may be disposed on at least one surface, of the first or second substrate 510 or 520.

Referring to FIG. 14, the first sensing electrode 2100 may be disposed on one surface of the first substrate 1100. In addition, the first wire connected to the first sensing electrode 2100 may be disposed. Further, the second sensing electrode 2200 and the second wire may be formed between the first and second substrates 510 and 520. That is the second sensing electrode 2200 and the second wire may be disposed inside the display panel, and the first sensing electrode 2100 and the first wire may be disposed outside the display panel.

The second sensing electrode 2200 and the second wire may be disposed on the top surface of the first substrate 510 or the rear surface of the second substrate 520.

In addition, the substrate 1100 may further include a polarizing plate below the first substrate 1100.

When the display panel is a liquid crystal display panel and the second sensing electrode is formed on the top surface of the first substrate 510, the sensing electrode may be formed with a thin film transistor (TFT) or a pixel electrode. In addition, when the second sensing electrode is formed on the rear surface of the second substrate 520, a color filter layer may be formed on the sensing electrode or the sensing electrode may be formed on the color filter layer. When the display panel is an organic light emitting device and the second sensing electrode is formed on the top surface of the first substrate 510, the second sensing electrode may be formed with a thin film transistor or an organic light emitting device.

According to a touch device of an embodiment, at least one substrate 100 for supporting the sensing electrode 300 may be omitted. Thus, a touch device having a thin thickness and a light weight may be formed. In addition, the sensing electrode and the wire are formed with a device formed on the display panel, so that the process may be simplified and the cost may be reduced.

FIGS. 15 to 18 are views showing one example of the touch device including the touch window described above.

Figure 15:
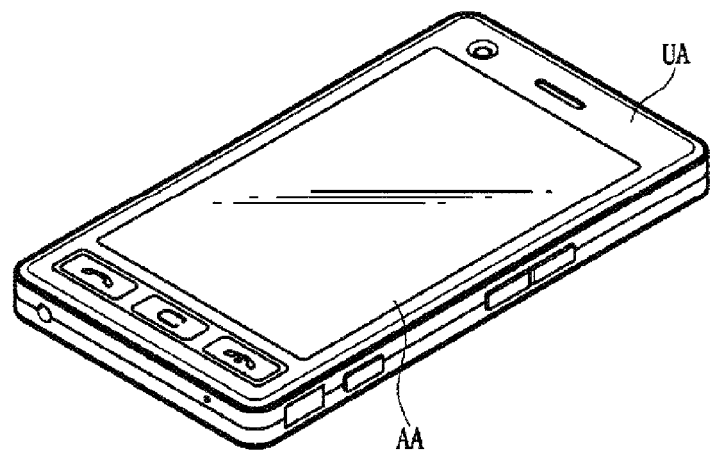
FIGS. 15 to 18 are views showing examples of the touch devices to which the touch windows according to the embodiments are employed.

Referring to FIG. 15, the mobile terminal may include the active area AA and the unactive area UA. The active area AA may sense a touch signal through the touch by a finger, and a command icon pattern part and a logo may be formed in the unactive area UA.

Figure 16:
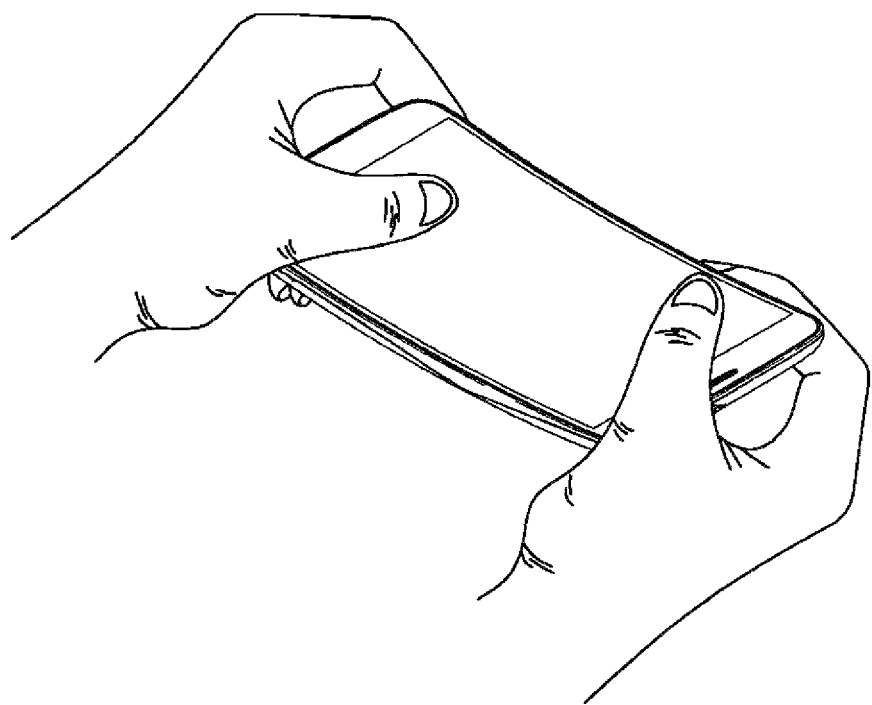

In addition, referring to FIG. 16, the touch window may include a flexible touch window that is capable of being bent. Accordingly, the touch display including the flexible touch window may be a flexible touch display. Thus, a user may bend or curve the flexible touch window with the hand of the user.

For example, such a flexible touch window may be applied to implement a wearable touch. That is, the wearable touch may be implemented by applying the flexible touch window to glasses or a watch worn on a human body.

Figure 17:
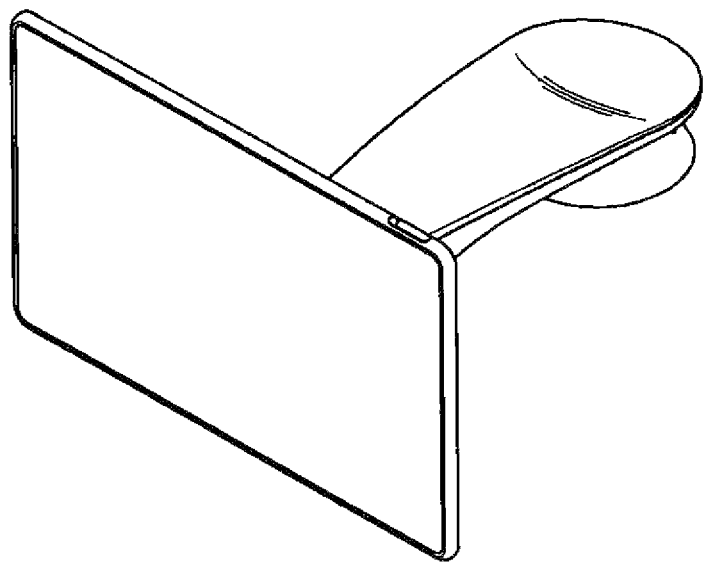

In addition, referring to FIG. 17, the touch window may be, applied to a vehicle navigation system.

In addition, referring to FIG. 18, the touch window may be applied to an inner part of a vehicle. In other words, the touch window may be applied to various parts in the vehicle. Accordingly, the touch window may be applied to a dashboard 100 as well as a PND (Personal Navigation Display), so that a CID (Center Information Display) may be realized. However, the embodiment is not limited to the above, and such a touch device may be used for various electronic appliances and of course, applied to wearable devices worn on such a human body.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An a touch window for detecting a touch comprising:
a substrate;
a resin layer on the substrate; and
an electrode layer on the resin layer,
wherein the resin layer comprises a plurality of engraved pattern parts,
wherein the electrode layer is provided in the plurality of engraved pattern parts,
wherein the plurality of engraved pattern parts have a mesh shape,
wherein the electrode layer has a mesh shape,
wherein the electrode layer comprises a first electrode layer and a second electrode layer,
wherein the first electrode layer is provided in the plurality of engraved pattern parts,
wherein the second electrode layer is provided on top of the first electrode layer,
wherein a bottom surface of the second electrode layer is in direct physical contact with the a top surface of the first electrode layer,
wherein the electrode layer includes a sensing electrode and a wire electrode,
wherein the electrode layer includes a carbonized metal,
wherein the first and second electrode layers have a psychrometric lightness (L*) of 60 or less,
wherein a psychrometric lightness of the second electrode layer is lower than a psychrometric lightness of the first electrode layer,
wherein a height of the engraved pattern parts is higher than a height of the electrode layer.

2. The a touch window for detecting a touch of claim 1, wherein the electrode layer including the sensing electrode and the wire electrode includes at least one of Cr, Ni, Cu, Al, Ag, Mo, Au, Ti and an alloy thereof.

3. The a touch window for detecting a touch of claim 1, wherein the engraved pattern part has a height of 1 μm to 6 μm, and the electrode layer is arranged to have a height of 70% to 90% based on the height of the engraved pattern part.

4. The a touch window for detecting a touch of claim 1, wherein the electrode material further includes a third electrode layer, the first electrode layer is disposed in the engraved pattern part, the second electrode material is disposed on the first electrode layer, the third electrode layer is disposed on the second electrode layer, and the psychrometric lightness (L*) of the first electrode layer and the third electrode layer are lower than the psychrometric lightness (L*) of the second electrode layer.

5. The a touch window for detecting a touch of claim 1, wherein a first electrode layer is arranged higher than a second electrode layer.

6. A touch window for detecting a touch comprising:
a first substrate; and
a second substrate on the first substrate,
wherein the touch window according to claim 1 is disposed on at least one of the first substrate and the second substrate.

7. A touch device comprising:
a touch window according to claim 6; and
a driving part on the touch window.

8. The a touch window for detecting a touch of claim 1, the ratio of the height of the first electrode layer and the height d4 the second electrode layer is 6:4 to 8:2.

9. The a touch window for detecting a touch of claim 1, wherein the first electrode layer includes silver,
wherein the second electrode layer includes carbonized silver.

10. The a touch window for detecting a touch of claim 1, wherein the substrate includes a flexible, curved or bent substrate.

11. The a touch window for detecting a touch of claim 1, wherein the substrate includes an active area and an inactive area,
wherein the a sensing electrode is provided in the active area,
wherein the wire electrode is provided in the inactive area.

12. The a touch window for detecting a touch of claim 1, wherein a width of the engraved pattern part is 10 μm or less.

13. The a touch window for detecting a touch of claim 1, wherein the sensing electrode includes a first sensing electrode and a second sensing electrode,
wherein the first sensing electrode and the second sensing electrode are provided on a same surface of the substrate.

* * * * *